US009691882B2

(12) United States Patent
Li et al.

(10) Patent No.: US 9,691,882 B2
(45) Date of Patent: Jun. 27, 2017

(54) CARBON-DOPED CAP FOR A RAISED ACTIVE SEMICONDUCTOR REGION

(71) Applicant: International Business Machines Corporation, Armonk, NY (US)

(72) Inventors: Zhengwen Li, Danbury, CT (US); Qing Cao, Yorktown Heights, NY (US); Kangguo Cheng, Schenectady, NY (US); Fei Liu, Yorktown Heights, NY (US); Zhen Zhang, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 40 days.

(21) Appl. No.: 13/802,986

(22) Filed: Mar. 14, 2013

(65) Prior Publication Data

US 2014/0264482 A1 Sep. 18, 2014

(51) Int. Cl.
*H01L 21/70* (2006.01)
*H01L 29/66* (2006.01)
(Continued)

(52) U.S. Cl.
CPC .. *H01L 29/66795* (2013.01); *H01L 21/02532* (2013.01); *H01L 21/02636* (2013.01); *H01L 21/28518* (2013.01); *H01L 21/31116* (2013.01); *H01L 21/76816* (2013.01); *H01L 21/76855* (2013.01); *H01L 21/82385* (2013.01); *H01L 21/823814* (2013.01); *H01L 21/823821* (2013.01); *H01L 21/823871* (2013.01); *H01L 21/84* (2013.01); *H01L 21/845* (2013.01); *H01L 27/1203* (2013.01); *H01L 27/1211* (2013.01);
(Continued)

(58) Field of Classification Search
CPC .............. H01L 29/1608; H01L 29/665; H01L 29/78618; H01L 27/092; H01L 27/24; H01L 27/2436; H01L 29/655; H01L 27/0922
USPC ......... 257/288, 382, E29.161, 369; 438/197, 438/630
See application file for complete search history.

(56) References Cited

U.S. PATENT DOCUMENTS 5,366,590 A  11/1994 Kadomura
5,445,712 A   8/1995 Yanagida
(Continued)

*Primary Examiner* — Jerome Jackson, Jr.
*Assistant Examiner* — John Lin
(74) *Attorney, Agent, or Firm* — Scully, Scott, Murphy & Presser, P.C.; Steven J. Meyers

(57) ABSTRACT

After formation of a disposable gate structure, a raised active semiconductor region includes a vertical stack, from bottom to top, of an electrical-dopant-doped semiconductor material portion and a carbon-doped semiconductor material portion. A planarization dielectric layer is deposited over the raised active semiconductor region, and the disposable gate structure is replaced with a replacement gate structure. A contact via cavity is formed through the planarization dielectric material layer by an anisotropic etch process that employs a fluorocarbon gas as an etchant. The carbon in the carbon-doped semiconductor material portion retards the anisotropic etch process, and the carbon-doped semiconductor material portion functions as a stopping layer for the anisotropic etch process, thereby making the depth of the contact via cavity less dependent on variations on the thickness of the planarization dielectric layer or pattern factors.

20 Claims, 12 Drawing Sheets

(51) Int. Cl.

| | | |
|---|---|---|
| *H01L 29/08* | (2006.01) | |
| *H01L 21/8238* | (2006.01) | |
| *H01L 21/84* | (2006.01) | |
| *H01L 27/12* | (2006.01) | |
| *H01L 21/311* | (2006.01) | |
| *H01L 21/02* | (2006.01) | |
| *H01L 29/45* | (2006.01) | |
| *H01L 21/285* | (2006.01) | |
| *H01L 21/768* | (2006.01) | |

(52) U.S. Cl.
CPC ........ *H01L 29/0847* (2013.01); *H01L 29/458* (2013.01); *H01L 29/665* (2013.01); *H01L 29/66545* (2013.01); *H01L 29/66628* (2013.01); *H01L 21/76805* (2013.01)

(56) References Cited

U.S. PATENT DOCUMENTS

| | | | | |
|---|---|---|---|---|
| 5,726,083 A | * | 3/1998 | Takaishi | H01L 27/10844 257/E21.008 |
| 6,001,729 A | * | 12/1999 | Shinriki | H01L 21/28518 257/E21.165 |
| 8,022,488 B2 | * | 9/2011 | Cheng | H01L 29/165 257/335 |
| 2005/0009258 A1 | * | 1/2005 | Inoue | H01L 27/1052 438/200 |
| 2009/0174002 A1 | * | 7/2009 | Ouyang et al. | 257/369 |
| 2011/0272764 A1 | * | 11/2011 | Kim | H01L 21/28273 257/368 |

* cited by examiner

CARBON-DOPED CAP FOR A RAISED ACTIVE SEMICONDUCTOR REGION

BACKGROUND

The present disclosure generally relates to semiconductor structures, and particularly to a semiconductor structure including a carbon-doped cap on a raised active semiconductor region of a transistor, and methods of manufacturing the same.

Complementary metal oxide semiconductor (CMOS) circuits employ field effect transistors having various channel lengths. Field effect transistors including channels that display short channel effects are referred to as short channel devices, which typically have a channel length that is on the same order of magnitude as a minimum lithographic length (that can be printed by a single lithographic deep ultraviolet exposure). Field effect transistors including channels that do not display short channel effects are referred to as long channel devices, which typically have a channel length that is at least one order of magnitude longer than the minimum lithographic length.

In replacement gate field effect transistors, the height of the top surface of a planarization dielectric layer is affected by the local spacing between dummy gate structures. The variation in the height of the top surface of the planarization dielectric layer affects the depth of a contact via hole that is formed into a raised source region or into a raised drain region. Further, reactive ion etch (RIE) lag that depends on the pattern factor of contact via holes affects the depth of an overetch into the raised source region or the raised drain region. Specifically, a contact via hole formed for a long channel device tends to be deeper than a contact via hole formed for a short channel device because the density of the contact via holes is higher in a region for short channel devices.

Such variations in the depth of the contact via holes result in variations in the location of metal semiconductor alloy regions that are subsequently formed on source regions, drain regions, raised source regions, and/or raised drain regions. Such variations in the locations of metal semiconductor alloy regions result in leakage currents in source regions and drain regions, and especially in devices in which a metal semiconductor alloy region extends further into a semiconductor substrate and/or toward a p-n junction between a body region and a source region or between a body region and a drain region. Thus, a systematic method for reducing the variations in the height of metal semiconductor alloy regions is desired.

SUMMARY

After formation of a disposable gate structure, a raised active semiconductor region is formed, which includes a vertical stack, from bottom to top, of an electrical-dopant-doped semiconductor material portion and a carbon-doped semiconductor material portion. A planarization dielectric layer is deposited over the raised active semiconductor region, and the disposable gate structure is replaced with a replacement gate structure. A contact via cavity is formed through the planarization dielectric material layer by an anisotropic etch process that employs a fluorocarbon gas as an etchant. The carbon in the carbon-doped semiconductor material portion retards the anisotropic etch process, and the carbon-doped semiconductor material portion functions as a stopping layer for the anisotropic etch process, thereby making the depth of the contact via cavity less dependent on variations on the thickness of the planarization dielectric layer or pattern factors.

According to an aspect of the present disclosure, a semiconductor structure is provided. The semiconductor structure includes a semiconductor material portion located on a substrate and including a source region, a drain region, and a body region. A planarization dielectric layer overlies the semiconductor material portion. A contact via structure is embedded in the planarization dielectric layer. A carbon-containing metal semiconductor alloy portion underlies the contact via structure and contacts one of the source region and the drain region. The source region and the drain region are substantially free of carbon.

According to another aspect of the present disclosure, a method of forming a semiconductor structure is provided. A semiconductor material portion is formed on a substrate. A raised active semiconductor region is formed on a semiconductor surface of the semiconductor material portion by selective deposition. The raised active semiconductor region includes a vertical stack, from bottom to top, of a carbon-free semiconductor material portion and a carbon-doped semiconductor material portion. A planarization dielectric layer is formed over the semiconductor material portion and the raised active semiconductor region. A via cavity is formed through the planarization dielectric layer by an anisotropic etch that employs the carbon-doped semiconductor material portion as a stopping layer.

DETAILED DESCRIPTION

Figure 1:
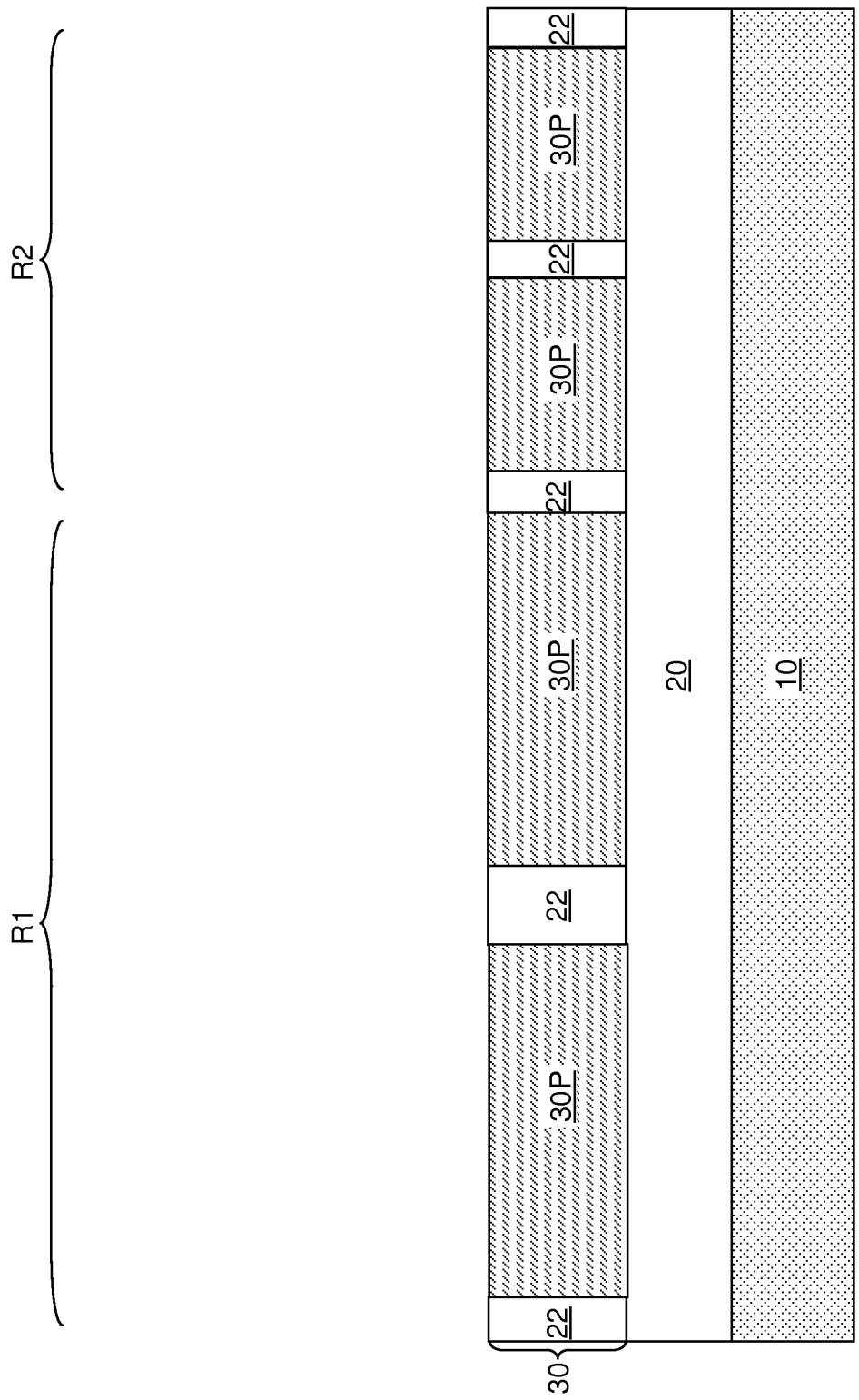
FIG. 1 is a vertical cross-sectional view of an exemplary semiconductor structure after formation of semiconductor material portions according to an embodiment of the present disclosure.

As stated above, the present disclosure relates to a semiconductor structure including a carbon-doped cap on a raised active semiconductor region of a transistor, and methods of manufacturing the same. Aspects of the present disclosure are now described in detail with accompanying figures. Like and corresponding elements mentioned herein and illustrated in the drawings are referred to by like reference numerals. The drawings are not necessarily drawn to scale. As used herein, ordinals are employed merely to distinguish similar elements, and different ordinals may be employed to designate a same element in the specification and/or claims.

Referring to FIG. 1, an exemplary semiconductor structure according to an embodiment of the present disclosure includes a semiconductor substrate, which can be a semiconductor-on-insulator (SOI) substrate, a bulk substrate, or a hybrid substrate including a bulk portion and an SOI portion. In one embodiment, the substrate can be an SOI substrate including a stack, from bottom to top, of a handle substrate 10, a buried insulator layer 20, and a top semiconductor layer 30. The handle substrate 10 can include a semiconductor material, a conductive material, or a dielectric material, and provides mechanical support to the buried insulator layer 20 and the top semiconductor layer 30L. The thickness of the handle substrate 10 can be from 50 microns to 2 mm, although lesser and greater thicknesses can also be employed. The buried insulator layer 20 includes a dielectric material such as silicon oxide, silicon nitride, silicon oxynitride or a combination thereof. The thickness of the buried insulator layer 20 can be from 10 nm to 1,000 nm, although lesser and greater thicknesses can also be employed.

The top semiconductor layer 30 includes a semiconductor material, which can be an elemental semiconductor material such as silicon or germanium, an alloy of at least two elemental semiconductor materials such as a silicon-germanium alloy, a compound semiconductor material, or any other semiconductor material known in the art. The thickness of the top semiconductor layer 30 can be from 30 nm to 600 nm, although lesser and greater thicknesses can also be employed. The top semiconductor layer 30 can include a single crystalline semiconductor material, a polycrystalline semiconductor material, or an amorphous semiconductor material. Various portions of the top semiconductor layer 30 may be doped with electrical dopants. An "electrical dopant" refers to a dopant that introduces free electrical charges in a semiconductor material, and can be a p-type dopant or an n-type dopant. Exemplary p-type dopants include B, Ga, and In, and exemplary n-type dopants include P, As, and Sb. Different portions of the top semiconductor layer 30 may include different semiconductor materials. In one embodiment, the top semiconductor layer 30 includes a single crystalline semiconductor material such as single crystalline silicon and/or a single crystalline silicon-germanium alloy.

While the present disclosure is described employing an SOI substrate, embodiments employing a bulk substrate or a hybrid substrate are expressly contemplated herein.

The top semiconductor layer 30 is patterned to form a plurality of semiconductor material portions 30P. The plurality of semiconductor material portions 30P can have different sizes. For example, a first device region R1 and a second device region R2 can be provided such that the first device region R1 includes semiconductor material portions 30P of greater areas than the second device region R2. In one embodiment, the first device region R1 can include semiconductor material portions 30P that are large enough to form long channel field effect transistors as known in the art, and the second device region R2 can include semiconductor material portions that are sized to form short channel field effect transistors as known in the art. In an illustrative example, the lateral dimension of each semiconductor material portions 30P in the first device region R1 along the channel direction of the field effect transistor to be formed thereupon can be at least 300 nm, while the lateral dimension of each semiconductor material portions 30P in the second device region R2 along the channel direction of the field effect transistor to be formed thereupon can be less than 300 nm.

The formation of the semiconductor material portions 30P by patterning of a semiconductor material layer can be performed, for example, by a combination of a lithographic method and an anisotropic etch. The buried insulator layer 20 can be employed as a stopping layer for the anisotropic etch. The plurality of semiconductor material portions 30P can be formed directly on the top surface of the buried insulator layer 20.

In one embodiment, the semiconductor material portions 30P can include single crystalline silicon material consisting essentially of silicon and optionally at least one electrical dopant. As used herein, an electrical dopant refers to p-type dopants (such as B, Ga, or In) and n-type dopants (P, As, or Sb). Thus, the semiconductor material portions 30P can consist of intrinsic single crystalline silicon, p-doped single crystalline silicon, or n-doped single crystalline silicon. In one embodiment, the semiconductor material portions can consist essentially of p-doped single crystalline silicon.

In one embodiment, the semiconductor material portions 30P can be patterned as planar active semiconductor regions for forming planar field effect transistors. As used herein, a "planar field effect transistor" refers to a field effect transistor in which a predominant portion of the interface between the channel region and the gate dielectric is at least one horizontal surface. In this case, shallow trench isolation structures 22 including a dielectric material can be formed within the top semiconductor layer 20, for example, by filling shallow trenches that separate each semiconductor material portion 30P with a dielectric material, and by removing excess portions of the dielectric material from above the top surfaces of the semiconductor material portions 30P.

In another embodiment, the semiconductor material portions 30P can be semiconductor fins that can be employed to form fin field effect transistors. As used herein, a "fin field effect transistor" refers to a field effect transistor in which a predominant portion of the interface between the channel region and the gate dielectric is at least one vertical surface. In this case, the semiconductor fins can be located on the top surface of the buried insulator layer 20, and the semiconductor fins can be laterally spaced from one another by gaps. Each semiconductor fin includes a parallel pair of substantially vertical sidewalls that extend along a lengthwise direction of the semiconductor fin. As used herein, a "lengthwise direction" of an object refers to a direction about which the moment of inertia of the object becomes the minimum. Each semiconductor fin laterally extends along a fin direction, which is the lengthwise direction of the semiconductor fin.

If the substrate 8 is a bulk substrate, the semiconductor material portions 30P formed by an anisotropic etch can be electrically isolated by forming shallow trench isolation structures 22 including a dielectric material and/or by forming doped wells that can be employed to form reverse biased p-n junctions. If the semiconductor material portions 30P on a bulk substrate are to be employed as semiconductor fins, top surfaces of the shallow trench isolation structures 22 can be recessed relative to the top surfaces of the semiconductor fins, i.e., the top surfaces of the semiconductor material portions 30P.

Figure 2:
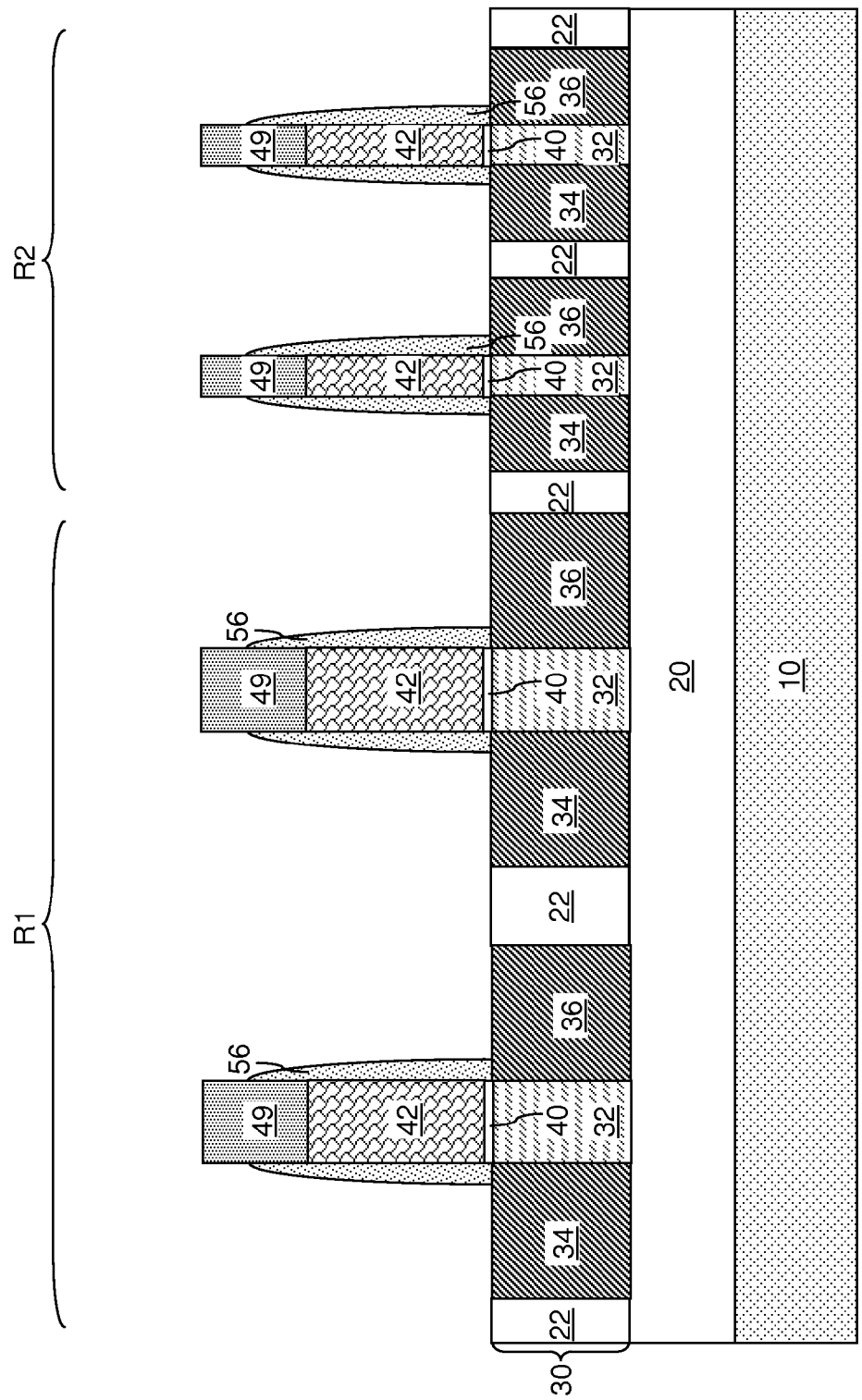
FIG. 2 is a vertical cross-sectional view of the exemplary semiconductor structure after formation of disposable gate structures according to an embodiment of the present disclosure.

Referring to FIG. 2, disposable gate level layers can be deposited on the substrate (10, 20, 30) as blanket layers, i.e., as unpatterned contiguous layers. The disposable gate level layers can include, for example, a vertical stack of a disposable gate dielectric layer, a disposable gate material layer, and a disposable gate cap dielectric layer. The disposable gate dielectric layer can be, for example, a layer of silicon oxide, silicon nitride, or silicon oxynitride. The thickness of the disposable gate dielectric layer can be from 1 nm to 10 nm, although lesser and greater thicknesses can also be employed. The disposable gate material layer includes a material that can be subsequently removed selective to the dielectric material of a planarization dielectric layer to be subsequently formed. For example, the disposable gate material layer can include a semiconductor material such as a polycrystalline semiconductor material or an amorphous semiconductor material. The thickness of the disposable gate material layer can be from 30 nm to 300 nm, although lesser and greater thicknesses can also be employed. The disposable gate cap dielectric layer can include a dielectric material such as silicon oxide, silicon nitride, or silicon oxynitride. The thickness of the disposable gate cap dielectric layer can be from 3 nm to 30 nm, although lesser and greater thicknesses can also be employed. Any other disposable gate level layers can also be employed provided that the material(s) in the disposable gate level layers can be removed selective to a planarization dielectric layer to be subsequently formed.

The disposable gate level layers are lithographically patterned to form disposable gate structures. Specifically, a photoresist (not shown) is applied over the topmost surface of the disposable gate level layers and is lithographically patterned by lithographic exposure and development. The pattern in the photoresist is transferred into the disposable gate level layers by an etch, which can be an anisotropic etch such as a reactive ion etch. The remaining portions of the disposable gate level layers after the pattern transfer constitute disposable gate structures.

Each disposable gate stack may include, for example, a stack of a disposable gate dielectric portion 40, a disposable gate material portion 42, and a disposable gate cap portion 49. Each disposable gate stack (40, 42, 49) can straddle one or more of the plurality of semiconductor fins 30. Each disposable gate stack (40, 42, 49) can extend along a lengthwise direction of the disposable gate stack (40, 42, 49). If the semiconductor material portions 30P (See FIG. 1) are semiconductor fins, the disposable gate stacks (40, 42, 49) may extend along a direction perpendicular to the fin direction.

Gate spacers 56 can be formed on sidewalls of each of the disposable gate structures (40, 42, 49), for example, by deposition of a conformal dielectric material layer and an anisotropic etch. The conformal dielectric material layer includes a dielectric material such as silicon oxide, silicon nitride, silicon oxynitride, or a combination. Horizontal portions of the conformal dielectric material layer are removed by the anisotropic etch. An overetch can be employed to remove vertical portions of the conformal dielectric material layer from portions of sidewalls of the plurality of semiconductor fins 30 that are laterally spaced from the disposable gate stacks (40, 42, 49) by a lateral distance greater than the thickness of the conformal dielectric material layer. Remaining vertical portions of the conformal dielectric material layer constitute the gate spacers 56. If the semiconductor material portions 30P (See FIG. 1) are laterally surrounded by shallow trench isolation structures 22, the gate spacers 56 can contact top surfaces of the shallow trench isolation structures 22. If the semiconductor material portions 30P are semiconductor fins and shallow trench isolation structures are not present, the gate spacers 56 can contact the top surface of the buried insulator layer 20, i.e., can be formed directly on the top surface of the buried insulator layer 20.

Each gate spacer 56 laterally surrounds a disposable gate structure (40, 43, 49). Each gate spacer 56 can be topologically homeomorphic to a torus, i.e., can be continuously stretched without creating or destroying a hole into a torus. As used herein, two objects are "topologically homeomorphic" to each other if a continuous mapping and a continuous inverse mapping exists between two objects such that each point in one object corresponds to a distinct and unique point in another object. As used herein, a "continuous" mapping refers to a mapping that does not create or destroy a singularity.

Ion implantations can be employed to form source regions 34 and drain regions 36. As used herein, an "active semiconductor region" refers to any semiconductor region that functions as an electrical node of a semiconductor device, and includes source regions and drain regions of filed effect transistors. Thus, the source regions 34 and the drain regions 36 of the exemplary semiconductor structure are herein collectively referred to as active semiconductor regions (34, 36). An unimplanted portion of each semiconductor material portion 30P located between a source region 34 and a drain region 36 constitutes a body region 32. A p-n junction, a p-i junction, or an n-i junction can be formed between each neighboring pair of a source region 34 and a body region 32 and between each neighboring pair of a drain region 36 and a body region 32. As used herein, a "p-i junction" is a junction between a p-doped region and an intrinsic region. As used herein, an "n-i junction" is a junction between an n-doped region and an intrinsic region. The source regions 34 and the drain regions 36 can be substantially free of carbon. As used herein, an element is "substantially free" of an element species if the element does not include the element species in a quantity that affects the property of the element in any manner and if the atomic concentration of the element species is not greater than 100 parts per billion (p.p.b.) in atomic concentration. Thus, the source regions 34 and the drain regions 36 do not include carbon in amounts greater than a trace quantity that does not affect the property of the source regions 34 and the drain regions 36. In one embodiment, any carbon content that may be present in the source regions 34 and the drain regions 36 is less than 10 parts per billion (p.p.b.), and may be less than 1 p.p.b.

Figure 3:
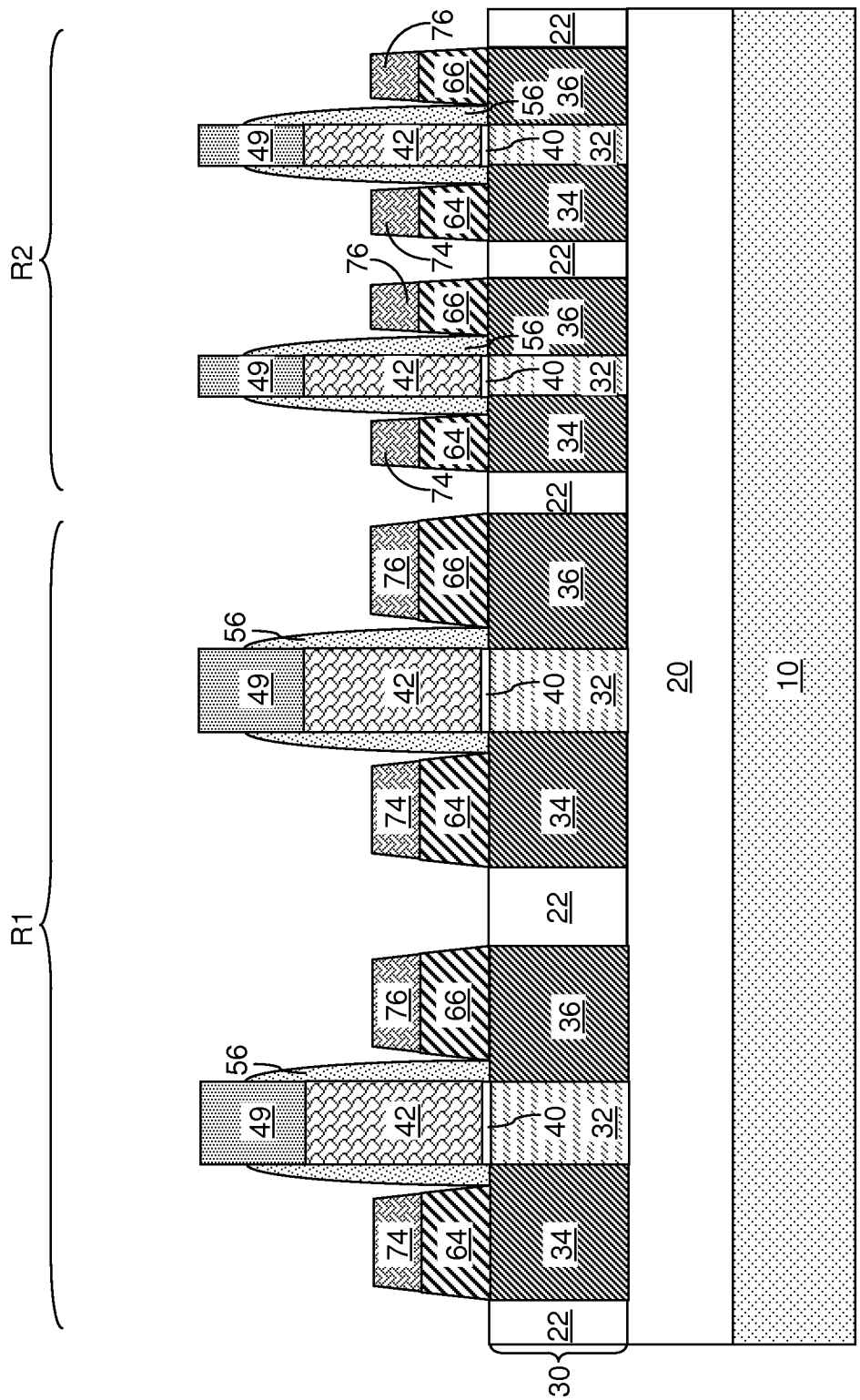
FIG. 3 is a vertical cross-sectional view of the exemplary semiconductor structure after formation of raised active semiconductor regions according to an embodiment of the present disclosure.

Referring to FIG. 3, raised active semiconductor regions are formed directly on the source regions 34 and the drain regions 36. The raised active semiconductor regions are active semiconductor regions that are located above, i.e., raised above, the top surface of the top semiconductor layer 30. The raised active semiconductor regions include raised source regions (64, 74) that are formed directly on physically exposed surfaces of the source region 34, and raised drain regions (66, 76) that are formed directly on physically exposed surfaces of the drain region 36.

Each raised source region (64, 74) includes a vertical stack, from bottom to top, of a carbon-free semiconductor material portion and a carbon-doped semiconductor material portion, which are herein referred to as a source-side carbon-free semiconductor material portion 64 and a source-side carbon-doped semiconductor material portion 74, respectively. Each raised drain region (66, 76) includes a vertical stack, from bottom to top, of a carbon-free semiconductor material portion and a carbon-doped semiconductor material portion, which are herein referred to as a drain-side carbon-free semiconductor material portion 66 and a drain-side carbon-doped semiconductor material portion 76, respectively.

The raised source regions (64, 74) and the raised drain regions (66, 76) can be formed by selective deposition of semiconductor materials. Specifically, a two-step selective deposition process can be employed to deposit the source-side carbon-free semiconductor material portions 64 and the drain-side carbon-free semiconductor material portion 66 in a first selective deposition step, and to subsequently deposit the source-side carbon-doped semiconductor material portions 74 and drain-side carbon-doped semiconductor material portions 76 in a second selective deposition step.

The carbon-free semiconductor material portions (64, 66) can include an intrinsic semiconductor material or a semiconductor material doped with at least one electrical dopant. The carbon-free semiconductor material portions (64, 66) are substantially free of carbon. In one embodiment, any carbon content that may be present in the carbon-free semiconductor material portions (64, 66) is less than 10 p.p.b., and may be less than 1 p.p.b.

The carbon-free semiconductor material portions (64, 66) are deposited by a first selective deposition process in which a first semiconductor material is deposited on semiconductor surfaces of the source regions 34 and the drain regions 36, but is not deposited on dielectric surfaces such as surfaces of the gate spacers 56, the disposable gate cap portions 49, and the shallow trench isolation structures 22 (or buried insulator layer 20 if shallow trench isolation structures are not present). During the first selective deposition process, a semiconductor precursor reactant and an etchant are simultaneously or alternatively flowed into a process chamber. Exemplary semiconductor precursor reactants include $SiH_4$, $SiH_2Cl_2$, $SiHCl_3$, $SiCl_4$, $Si_2H_6$, $GeH_4$, $Ge_2H_6$, and other semiconductor precursor reactants known in the art. An exemplary etchant is HCl. Carrier gases such as hydrogen, helium, argon, and/or nitrogen may be optionally flowed with the semiconductor precursor reactant and/or with the etchant.

The carbon-free semiconductor material portions (64, 66) can be single crystalline, polycrystalline, or amorphous. The thickness of the carbon-free semiconductor material portions (64, 66), as measured in thickest portions thereof, can be in a range from 3 nm to 60 nm, although lesser and greater thicknesses can also be employed.

In one embodiment, the first semiconductor material of the carbon-free semiconductor material portions (64, 66) can include intrinsic silicon or n-doped silicon. In one embodiment, the first semiconductor material of the carbon-free semiconductor material portions (64, 66) can include intrinsic single crystalline silicon or n-doped single crystalline silicon. In one embodiment, the first semiconductor material of the carbon-free semiconductor material portions (64, 66) can consist of intrinsic silicon or n-doped silicon. In one embodiment, the first semiconductor material of the carbon-free semiconductor material portions (64, 66) can consist of intrinsic single crystalline silicon or n-doped single crystalline silicon.

The carbon-doped semiconductor material portions (74, 76) include a carbon-doped semiconductor material. The carbon-doped semiconductor material portions (74, 76) include carbon at an atomic concentration greater than 0.1%. In one embodiment, the carbon-doped semiconductor material portions (74, 76) include carbon at an atomic concentration in a range from 0.5% to 10%. In another embodiment, the atomic concentration of carbon in the carbon-doped semiconductor material portions (74, 76) can be greater than 1.0%. In yet another embodiment, the atomic concentration of carbon in the carbon-doped semiconductor material portions (74, 76) can be greater than 2.0%. In still another embodiment, the atomic concentration of carbon in the carbon-doped semiconductor material portions (74, 76) can be greater than 5.0%. In one embodiment, the atomic concentration of carbon in the carbon-doped semiconductor material portions (74, 76) can be less than 5.0%. In another embodiment, the atomic concentration of carbon in the carbon-doped semiconductor material portions (74, 76) can be less than 2.0%. It is noted that carbon-doped silicon cannot be deposited as a single crystalline material when the atomic concentration of carbon exceeds 2%.

The carbon-doped semiconductor material portions (74, 76) are deposited by a second selective deposition process in which a second semiconductor material is deposited on semiconductor surfaces of the carbon-free semiconductor material portions (64, 66), but is not deposited on dielectric surfaces such as surfaces of the gate spacers 56, the disposable gate cap portions 49, and the shallow trench isolation structures 22 (or buried insulator layer 20 if shallow trench isolation structures are not present). During the second selective deposition process, a semiconductor precursor reactant, a carbon precursor gas, and an etchant are simultaneously or alternatively flowed into a process chamber. Exemplary semiconductor precursor reactants include $SiH_4$, $SiH_2Cl_2$, $SiHCl_3$, $SiCl_4$, $Si_2H_6$, $GeH_4$, $Ge_2H_6$, and other semiconductor precursor reactants known in the art. Exemplary carbon precursor gases include $C_2H_2$, $C_2H_4$, $C_2H_6$, and $CH_4$. An exemplary etchant is HCl. Carrier gases such as hydrogen, helium, argon, and/or nitrogen may be optionally flowed with the semiconductor precursor reactant and/or with the etchant.

The carbon-doped semiconductor material portions (74, 76) can be single crystalline, polycrystalline, or amorphous. The thickness of the carbon-doped semiconductor material portions (74, 76), as measured in thickest portions thereof, can be in a range from 3 nm to 60 nm, although lesser and greater thicknesses can also be employed.

In one embodiment, the second semiconductor material of the carbon-doped semiconductor material portions (74, 76) can include carbon-doped silicon that may, or may not, include an electrical dopant. In one embodiment, the second semiconductor material of the carbon-free semiconductor material portions (74, 76) can include single crystalline carbon-doped silicon that may, or may not, include an electrical dopant. In one embodiment, the second semiconductor material of the carbon-doped semiconductor material portions (74, 76) can consist of carbon-doped silicon that may, or may not, include an electrical dopant. In one embodiment, the second semiconductor material of the carbon-free semiconductor material portions (74, 76) can consist of single crystalline carbon-doped silicon that may, or may not, include an electrical dopant.

In general, each raised active semiconductor region (64, 74, 66, 76) is formed on a semiconductor surface of a semiconductor material portion (32, 34, 46) by selective deposition. Each raised active semiconductor region (64, 75, 666, 76) includes a vertical stack, from bottom to top, of a carbon-free semiconductor material portion (64, 66) and a carbon-doped semiconductor material portion (74, 76).

Figure 4:
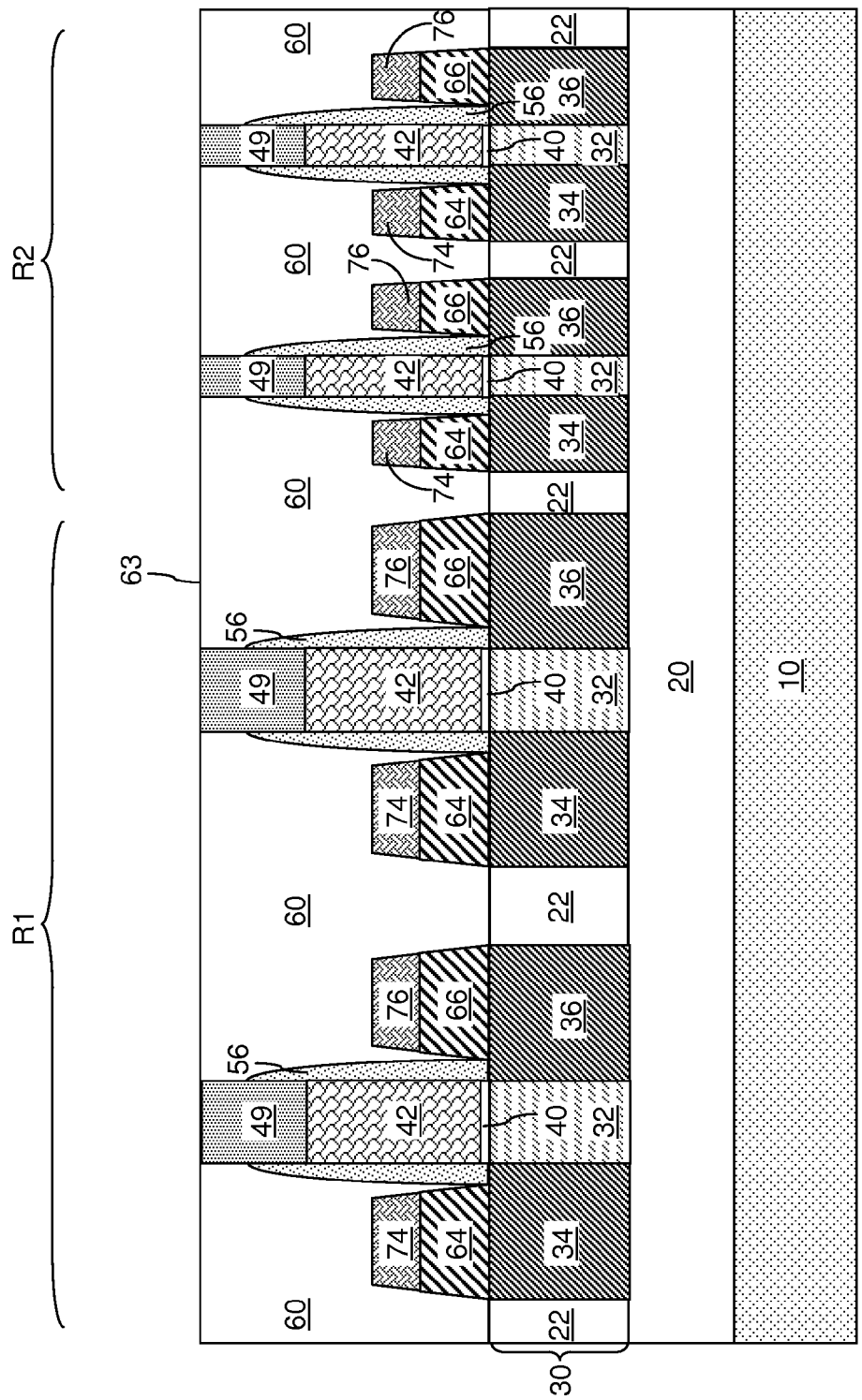
FIG. 4 is a vertical cross-sectional view of the exemplary semiconductor structure after deposition and planarization of a dielectric layer according to an embodiment of the present disclosure.

Referring to FIG. 4, a dielectric material layer is deposited over the semiconductor material portions (32, 34, 36), the raised active semiconductor regions (54, 74, 66, 76), and the disposable gate structures (40, 42, 49). The deposited dielectric material layer is herein referred to as a planarization dielectric layer 60. The thickness of the planarization dielectric layer 60 as deposited can be controlled such that all portions of the top surface of the planarization dielectric layer 60 are located at, or above, top surfaces of the disposable gate cap portions 49. The planarization dielectric layer 60 is subsequently planarized such that a top surface of a disposable gate cap portion 49 is physically exposed at each portion of the disposable gate structures (40, 42, 49). After the planarization of the planarization dielectric layer 60, a planar dielectric surface 63 of the planarization dielectric layer 60 can be coplanar with each top surface of the disposable gate cap portions 49.

Figure 5:
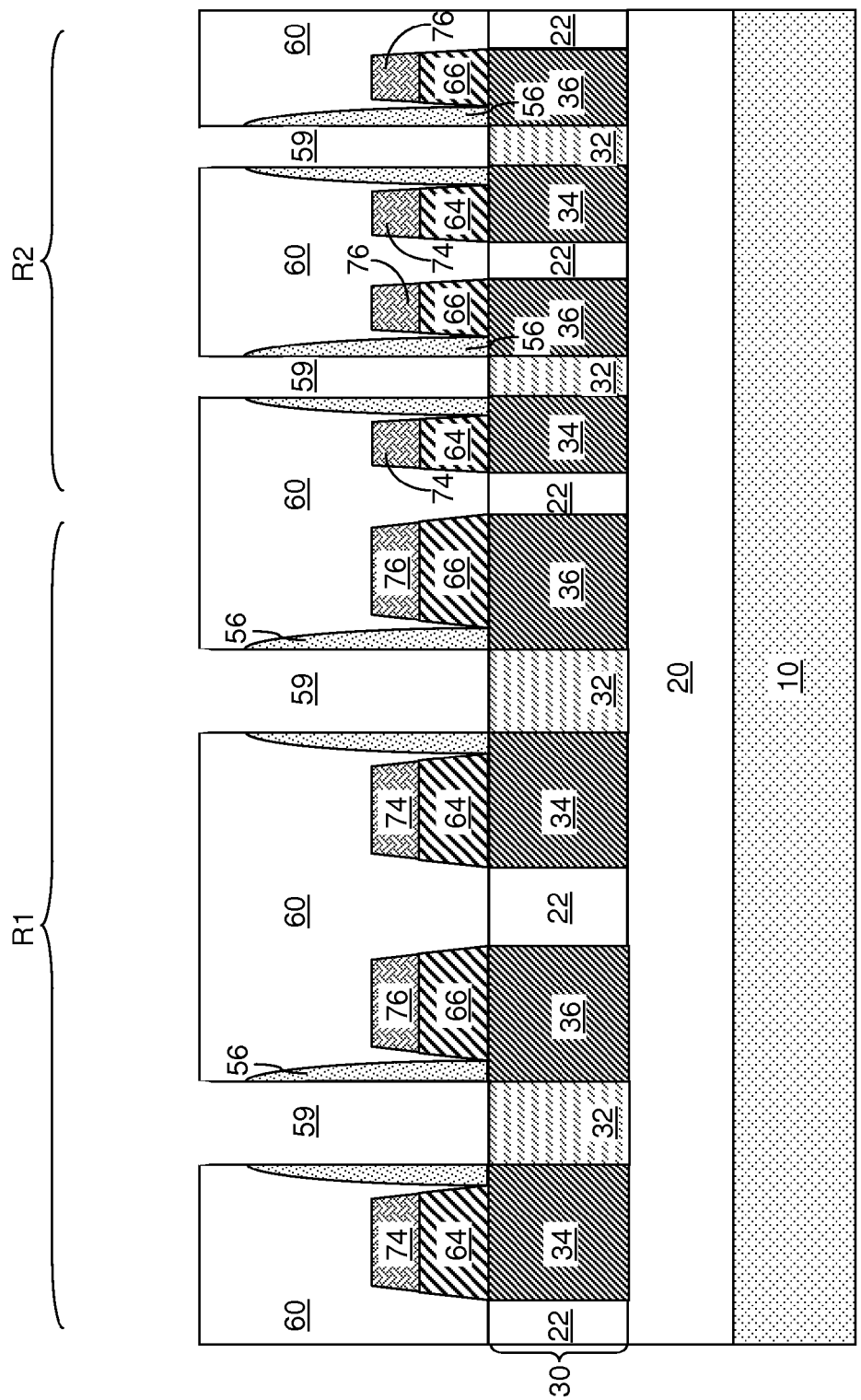
FIG. 5 is a vertical cross-sectional view of the exemplary semiconductor structure after removal of disposable gate structures according to an embodiment of the present disclosure.

Referring to FIG. 5, the disposable gate structures (40, 42, 49) are removed selective to the dielectric material of the planarization dielectric layer 60 and/or selective to the semiconductor material of the semiconductor material portions (32, 34, 36). Suitable etch chemistries may be employed to remove the disposable gate structures (40, 42, 49) selective to the planarization dielectric layer 60 and/or the semiconductor material portions (32, 34, 36). In an illustrative example, if the disposable gate cap portions 49 include silicon nitride, the disposable gate material portions 42 include a semiconductor material, and the planarization dielectric layer 60 includes silicon oxide, a wet etch employing hot phosphoric acid can be employed to remove the disposable gate cap portions 49 selective to the planarization dielectric layer 60, and a wet etch or a dry etch can be employed to remove the semiconductor material of the disposable gate material portions 42 selective to the planarization dielectric layer 60. The disposable gate dielectric portions 40 can be subsequently removed selective to the semiconductor material of the body regions 32, for example, by a wet etch. A gate cavity 59 is formed in each space from which a disposable gate structure (40, 42, 49) is removed.

Figure 6:
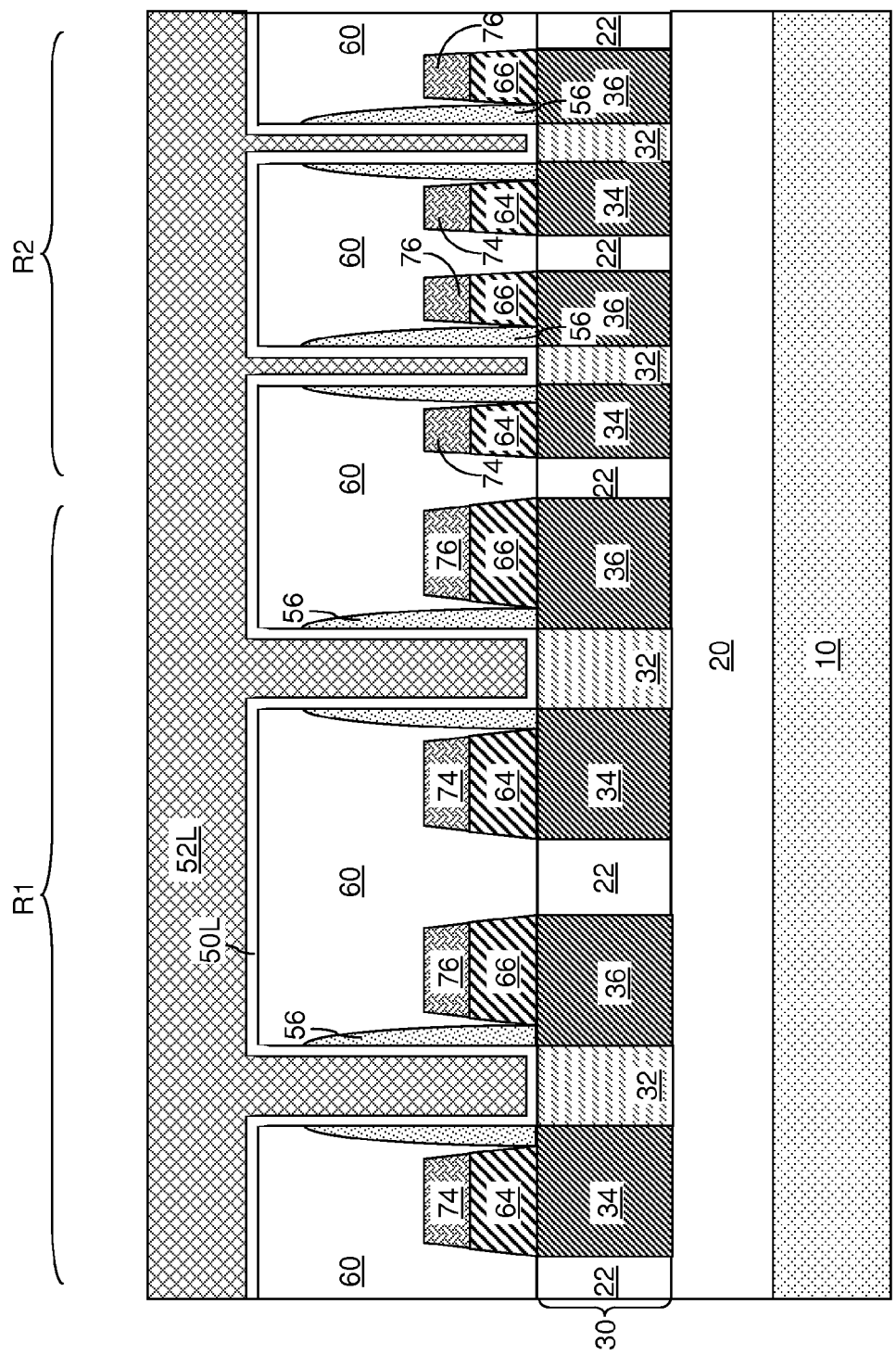
FIG. 6 is a vertical cross-sectional view of the exemplary semiconductor structure after deposition of a gate dielectric layer and a gate electrode layer according to an embodiment of the present disclosure.

Referring to FIG. 6, the gate cavities 59 are filled with a gate dielectric layer 50L and a conductive material layer 52L. The gate dielectric layer 50L can include a dielectric metal oxide, a dielectric semiconductor oxide, or a combination thereof. In one embodiment, the gate dielectric layer 50L can be deposited by a conformal deposition method such as atomic layer deposition (ALD) and/or chemical vapor deposition (CVD). In this case, all vertical portions of the gate dielectric layer can have a same thickness. In one embodiment, horizontal portions of the gate dielectric layer can also have the same thickness.

Figure 7:
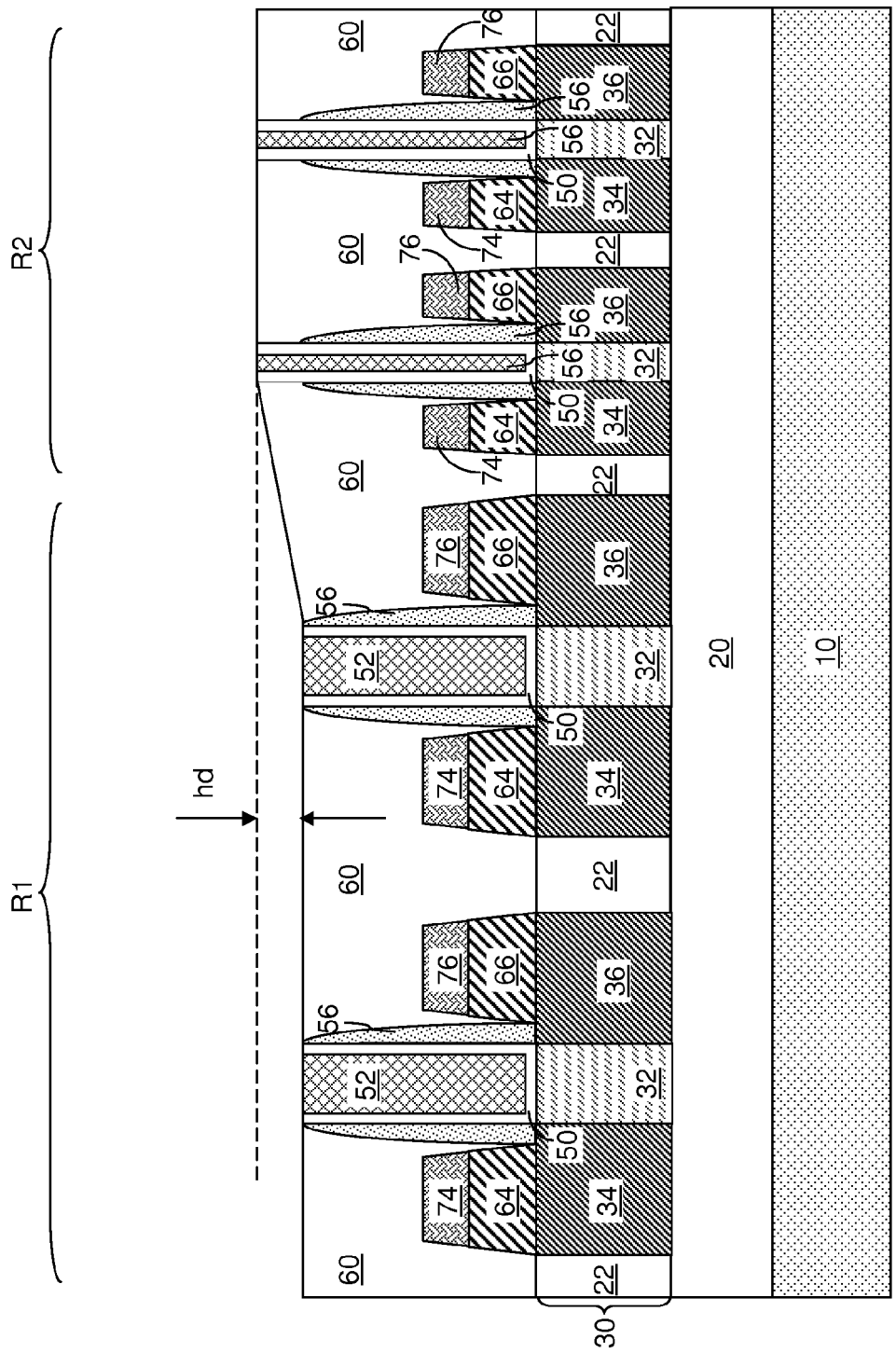
FIG. 7 is a vertical cross-sectional view of the exemplary semiconductor structure after planarization of the gate electrode layer and the gate dielectric layer according to an embodiment of the present disclosure.

Referring to FIG. 7, excess portions of the conductive material layer 52L are removed from above the top surface of the planarization dielectric layer 60, for example, by planarization. For example, chemical mechanical planarization (CMP) can be employed to remove the portions of the conductive material layer 52L from above the top surface of the planarization dielectric layer 60. Portions of the gate dielectric layer 50L may also be removed from above the top surface of the planarization dielectric layer 60. Remaining portions of the gate dielectric layer 50L and the conductive material layer 52L fill the gate cavities 59.

A remaining portion of the gate dielectric layer 50L in a gate cavity 59 constitutes a gate dielectric 50. A remaining portion of the conductive material layer 52L in a gate cavity 59 constitutes a gate electrode 52. Each stack of a gate dielectric 50 and a gate electrode 52 constitutes a replacement gate stack structure (50, 52), which is a gate stack structure including a replacement gate electrode. In one embodiment, all vertical portions of the gate dielectrics 50 can have the same thickness. In one embodiment, all vertical portions and all horizontal portions of the gate dielectrics 50 can have the same thickness.

The replacement gate stack structures (50, 52) are embedded in the planarization dielectric layer 60. Each replacement gate stack structure (50, 52) includes a gate dielectric 50 and a gate electrode 52 that is embedded in the gate dielectric 50. Each gate dielectric 50 can include a horizontal portion in contact with a body region 32 and a vertical portion having outer sidewalls that define a lateral extent of the replacement gate stack structure (50, 52).

In one embodiment, dishing may occur during the removal of the portions of the gate dielectric layer 50L and the conductive material layer 52L from above the planarization dielectric layer 60 by planarization. If chemical mechanical planarization is employed to remove the portions of the gate dielectric layer 50L and the conductive material layer 52L from above the planarization dielectric layer 60, the amount of removal of an upper portion of the planarization dielectric layer 60 can be pattern dependent, and non-planar and/or non-horizontal surfaces may be formed as the top surface of the planarization dielectric layer 60 after formation of the replacement gate stack structures (50, 52). For example, the top surface of the planarization dielectric layer 60 may be recessed further in the first device region R1 having a lesser pattern factor of the replacement gate stack structures (50, 52) than the first device region R2. In one embodiment, the height differential hd between the height of the top surface of the planarization dielectric layer 60 in the second device region R2 and the height of the top surface of the planarization dielectric layer 60 in the first device region R1 can be in a range from 10 nm to 30 nm. Further, portions of the top surfaces of the planarization dielectric layer 60 may be non-horizontal and/or non-planar.

Figure 8:
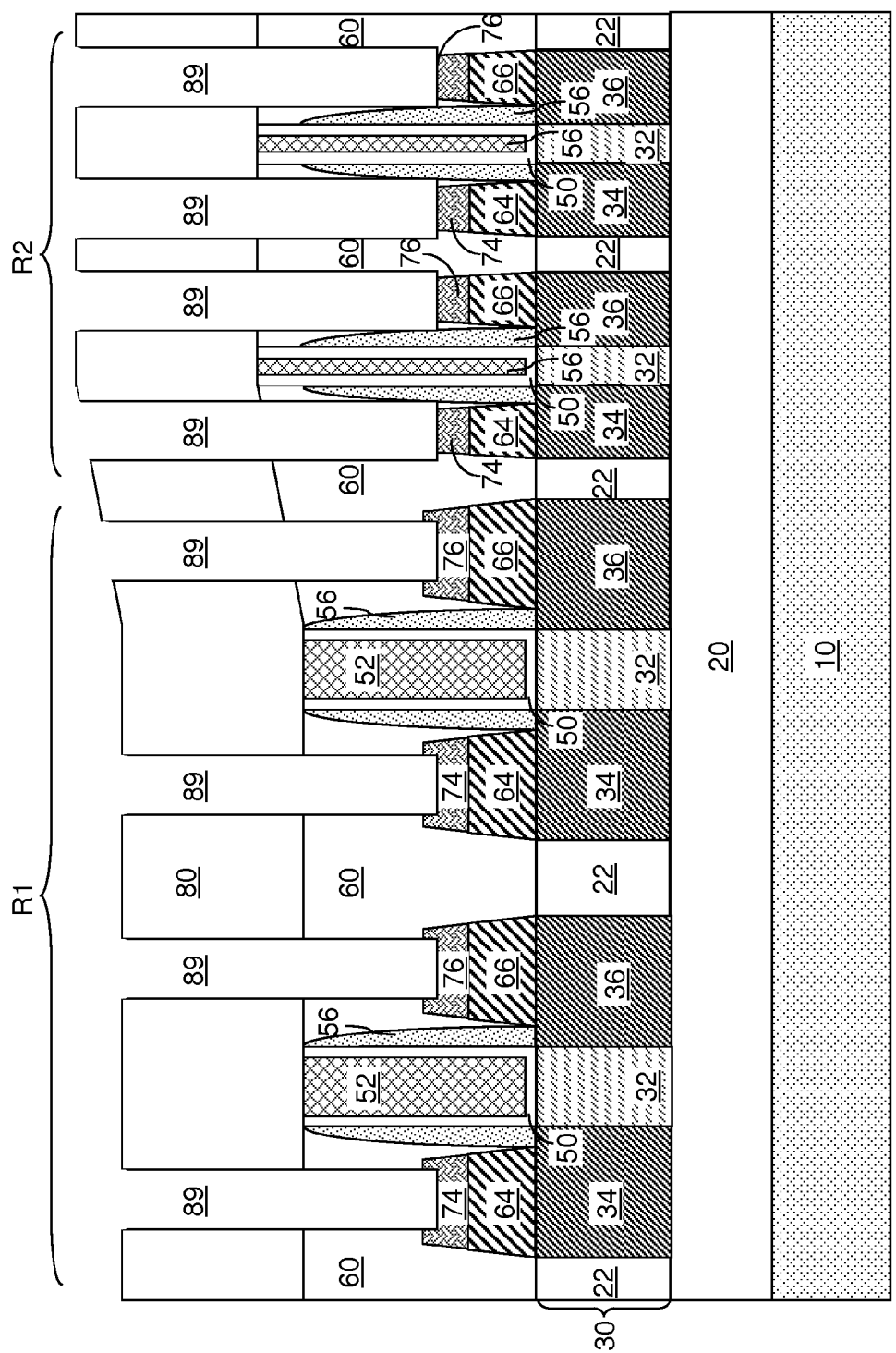
FIG. 8 is a vertical cross-sectional view of the exemplary semiconductor structure after deposition of a contact-level dielectric layer and formation of various contact via holes according to an embodiment of the present disclosure.

Referring to FIG. 8, a contact-level dielectric layer 80 can be deposited over the planarization dielectric layer 60. Various via cavities, which are herein referred to as contact via cavities 89, are formed through the stack of the planarization dielectric layer 60 and the contact-level dielectric layer, for example, by application and lithographic patterning of a photoresist layer (not shown) and by performing an anisotropic etch process that etches the dielectric materials of the contact-level dielectric layer 80 and the planarization dielectric layer 60. The anisotropic etch process can be a reactive ion etch process that employs a plasma of at least one etchant gas.

In one embodiment, the contact via cavities 89 can overlie the raised active semiconductor regions (64, 75, 66, 76), i.e., the raised source regions (64, 74) and the raised drain regions (66, 76). The chemistry of the anisotropic etch process is selected such that the anisotropic etch process is selective to a carbon-containing material. For example, the chemistry of the anisotropic etch process can employ at least one fluorocarbon gas that may be selected from, for example, $CH_3F$, $CH_2F_2$, $C_4F_6$, and $C_4F_8$. The reactivity of the at least one fluorocarbon gas is reduced when carbon atoms become available at the bottom of the contact via cavities 89 because the carbon atoms combine with the plasma of the at least one fluorocarbon gas to reduce the reactivity of the plasma.

In this case, the anisotropic etch process employs the carbon-doped semiconductor material portions (74, 76), i.e., the as stopping layers. In one embodiment, the anisotropic etch process can stop before the carbon-doped semiconductor material portions (74, 76) are etched through, i.e., while the bottom surfaces of the via cavities 89 are surfaces of the carbon-doped semiconductor material portions (74, 76).

Figure 9:
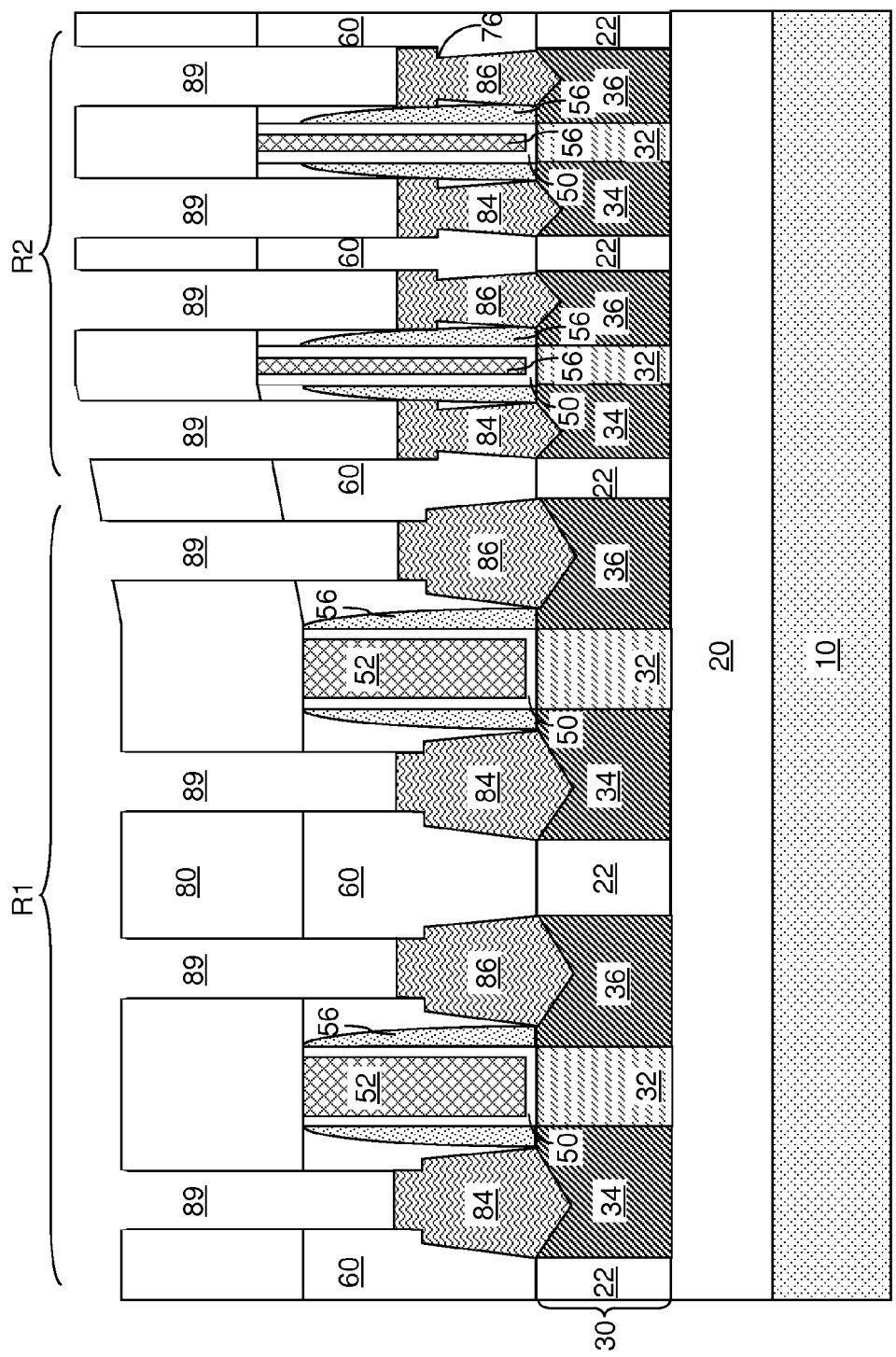
FIG. 9 is a vertical cross-sectional view of the exemplary semiconductor structure after formation of carbon-containing metal semiconductor alloy portions according to an embodiment of the present disclosure.

Referring to FIG. 9, carbon-containing metal semiconductor alloy portions (84, 86) are formed by reacting the raised active semiconductor regions (64, 75, 66, 76) and optionally upper portions of the source regions 34 and the drain regions 36 with a metallic material. Specifically, a metallic material is deposited on the bottom surfaces of the contact via trenches 89 by a conformal or non-conformal deposition method. For example, the metallic material can be deposited by physical vapor deposition (PVD) or chemical vapor deposition (CVD). The metallic material can be an elemental metal or an intermetallic alloy including at least two elemental metals. For example, the metallic material can include one or more of Ni, Co, Ta, Ti, W, and Pt. The metallic material can be deposited within the contact via cavities 89 and directly on surfaces of remaining portions of the carbon-doped semiconductor material portions (74, 76). The carbon-containing metal semiconductor alloy portions (84, 86) are formed by reacting the metallic material and at least one semiconductor material portion including the remaining portions of the carbon-doped semiconductor material portions (74, 76). The carbon-containing metal semiconductor alloy portions (84, 86) include source-side carbon-containing metal semiconductor alloy portions 84 and drain-side carbon-containing metal semiconductor alloy portions 86.

The exemplary semiconductor structure includes at least a semiconductor material portion (32, 34, 36) located on a substrate (10, 20) and including a source region 34, a drain region 36, and a body region 32; a planarization dielectric layer 60 overlying the semiconductor material portion (32, 34, 36); and a carbon-containing metal semiconductor alloy portion (84 or 86) contacting one of the source region 34 and the drain region 36. The source region 34 and the drain region 36 are substantially free of carbon.

In one embodiment, within each carbon-containing metal semiconductor alloy portion (84 or 86), the diffusion of carbon atoms from the volume of remaining portions of the carbon-doped semiconductor material portions (74, 76) into the volume of the carbon-free semiconductor material portions (64, 66) may be incomplete, i.e., the carbon concentration in the carbon-containing metal semiconductor alloy portions (84, 86) may be inhomogeneous. In this case, the atomic concentration of carbon in the carbon-containing metal semiconductor alloy portions (84, 86) can increase with a vertical distance from the top surface of the substrate (10, 20) that includes the buried insulator layer 20 and the handle substrate 10. In one embodiment, the ratio of carbon atoms to semiconductor atoms in the carbon-containing metal semiconductor alloy portions (84, 86) may be greater than 0.01. In one embodiment, the atomic concentration of carbon in the carbon-doped semiconductor material portions (74, 76) may exceed the limit above which epitaxial deposition of a carbon-doped silicon material is impossible, i.e., 2%. In this case, the ratio of carbon atoms to semiconductor atoms in the carbon-containing metal semiconductor alloy portions (84, 86) may be greater than 0.02.

In one embodiment, the carbon-containing metal semiconductor alloy portions (84, 86) may be doped with at least one electrical dopant, which can include dopants originating from portions of the source regions 34 and drain regions 36 that are converted into a metal semiconductor alloy material and may include dopants originating from carbon-free semiconductor material portions (64, 66) in case the carbon-free semiconductor material portions (64, 66) are formed with one or more electrical dopants. In one embodiment, the vertical diffusion of the at least one electrical dopant within the carbon-containing metal semiconductor alloy portions (84, 86) may not be complete. In this case, the total atomic concentration of the at least one electrical dopant in the carbon-containing metal semiconductor alloy portions (84, 86) can decrease with a vertical distance from the top surface of the substrate (10, 20).

In one embodiment, the at least one electrical dopant is at least one n-type dopant. In one embodiment, the carbon-containing metal semiconductor alloy portions (84, 86) can include a carbon-containing metal silicide. In one embodiment, the source regions 34 and the drain regions 36 can consist of silicon and dopant atoms having the same conductivity type as the at least one electrical dopant. For example, the source regions 34 and the drain regions 36 can consist of silicon and n-type dopants.

The replacement gate stack structures (50 52), which are gate stack structures, are embedded in the planarization dielectric layer 60. Each replacement gate structure (50, 52) includes a gate dielectric 50 (which is a U-shaped gate dielectric including a horizontal portion and vertical portions) and a gate electrode 52 that is embedded in the gate dielectric 50.

Additional semiconductor devices may be formed in other parts of the exemplary semiconductor structure that are not illustrated. For example, p-type field effect transistors (not shown) and passive devices such as resistors, capacitors, and inductors (not shown) may be formed on the same substrate (10, 20). Any method known in the art form forming such devices may be employed provided that such a method is compatible with the methods of the present disclosure.

Figure 10:
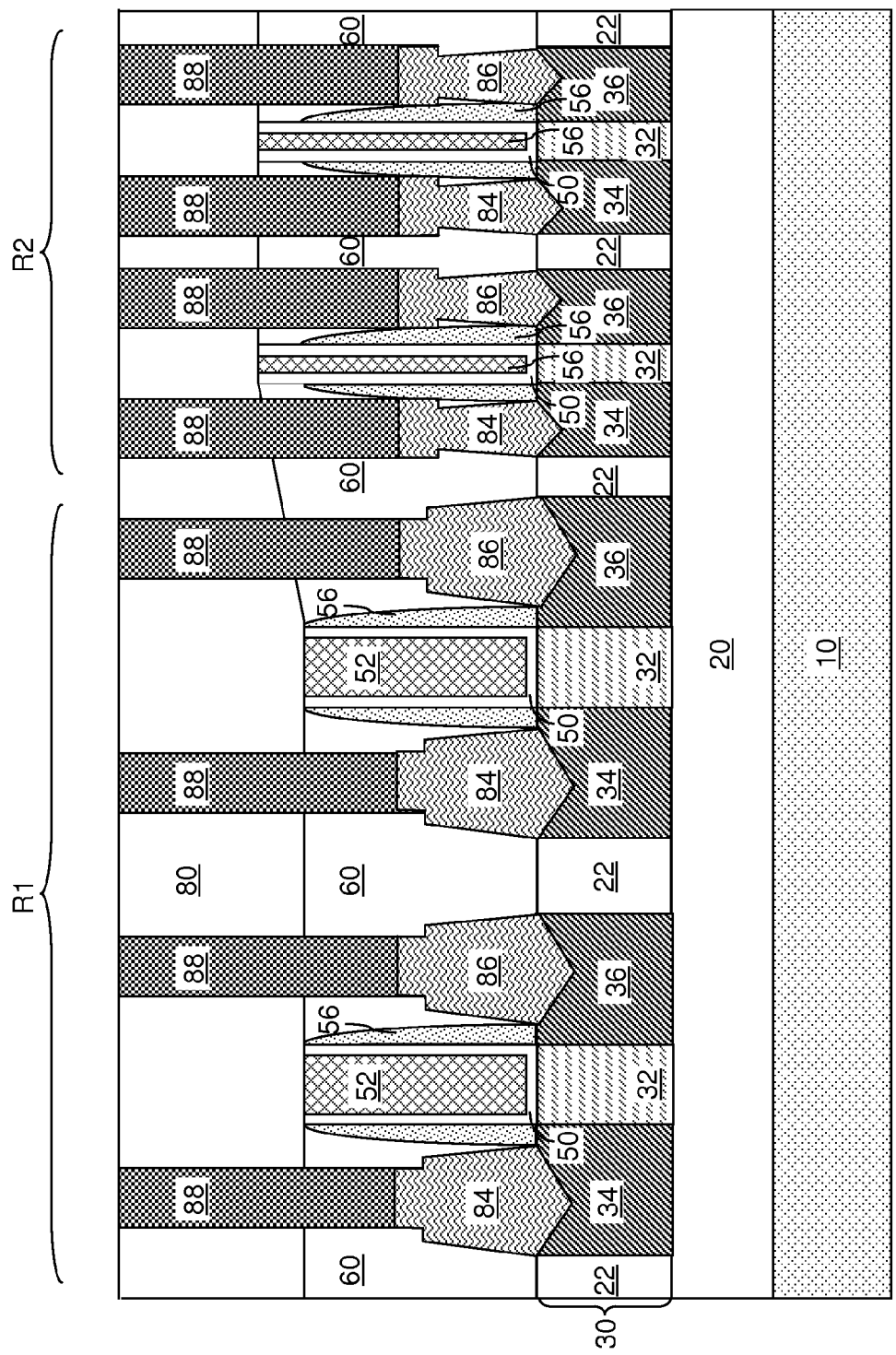
FIG. 10 is a vertical cross-sectional view of the exemplary semiconductor structure after formation of various active semiconductor region contact via structures according to an embodiment of the present disclosure.

Referring to FIG. 10, various contact via structures 88 can be formed through the contact-level dielectric layer 80 and the planarization dielectric layer 60 by filling the contact via cavities 89 with at least one conductive material. The at least one conductive material can include, for example, TiN, TaN, WN, TiC, TaC, WC, W, Cu, Al, CoWP, or alloys or combinations thereof. Excess portions of the at least one conductive material can be removed, for example, by a planarization process, which can provide a horizontal top surface for the contact-level dielectric layer 80.

Because upper portions of the carbon-containing metal semiconductor alloy portions (84, 86) and the contact via structures 88 are formed in a manner that fills the contact via cavities 89, sidewalls of a bottom portion of each contact via structure 88 can be vertically coincident with sidewalls of a top surface of a carbon-containing metal semiconductor alloy portion (84, 86). As used herein, two surfaces are vertically coincident if the two surfaces are within a same vertical plane (which may, or may not, have a curvature in directions that are perpendicular to the vertical direction). Each contact via structure 88 is embedded in the planarization dielectric layer 60. A carbon-containing metal semiconductor alloy portion (84, 96) can underlie each contact via structure 88 and contact one of the source regions 34 and the drain regions 36.

Figure 11:
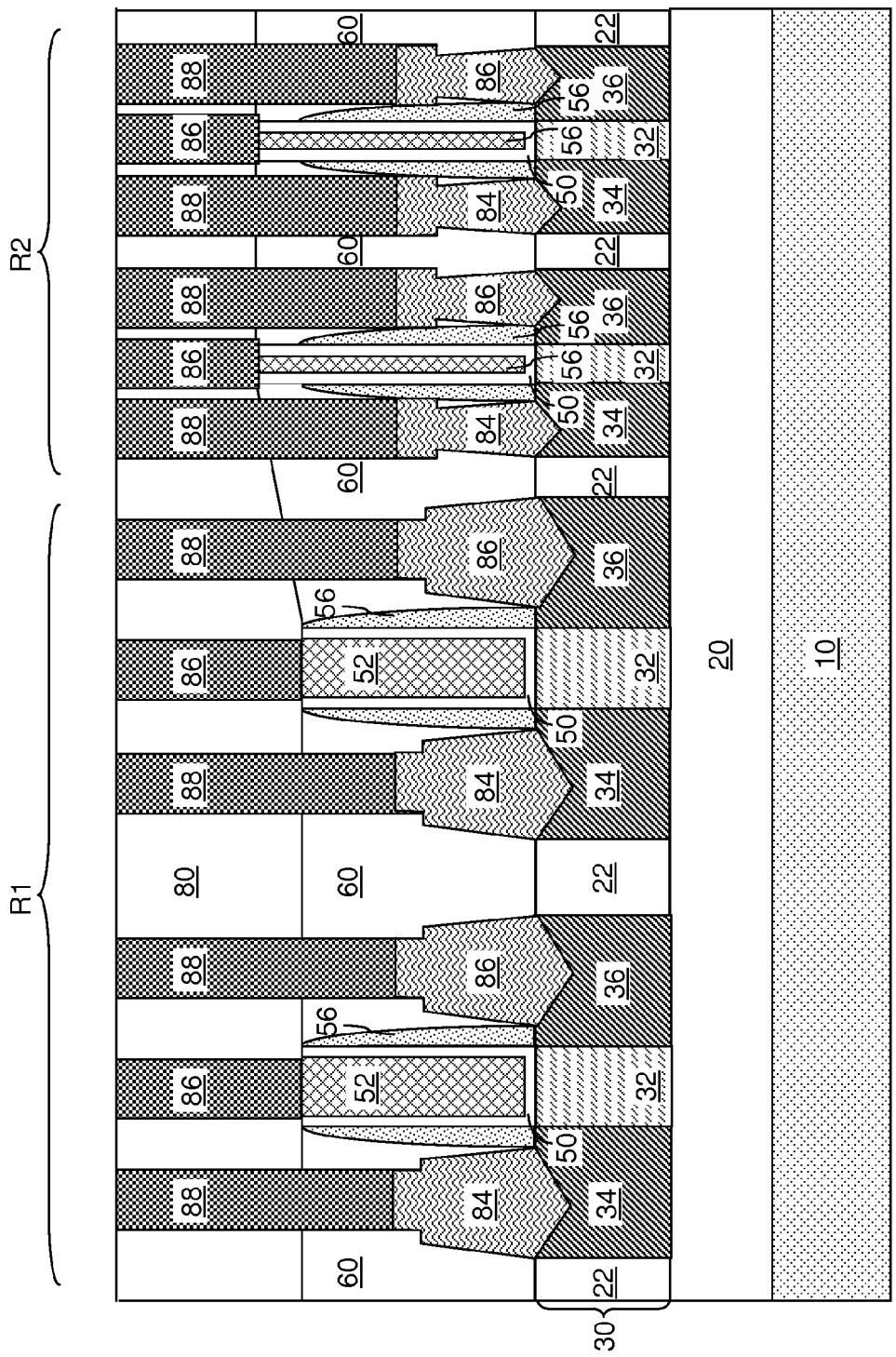
FIG. 11 is a vertical cross-sectional view of the exemplary semiconductor structure after formation of various gate contact via structures according to an embodiment of the present disclosure.

Referring to FIG. 11, various gate contact via structures 86 can be formed by forming cavities above the replacement gate stack structures (50, 52) to physically expose top surfaces of the replacement gate stack structures (50, 52), and by filling the cavities with at least one conductive material.

Figure 12:
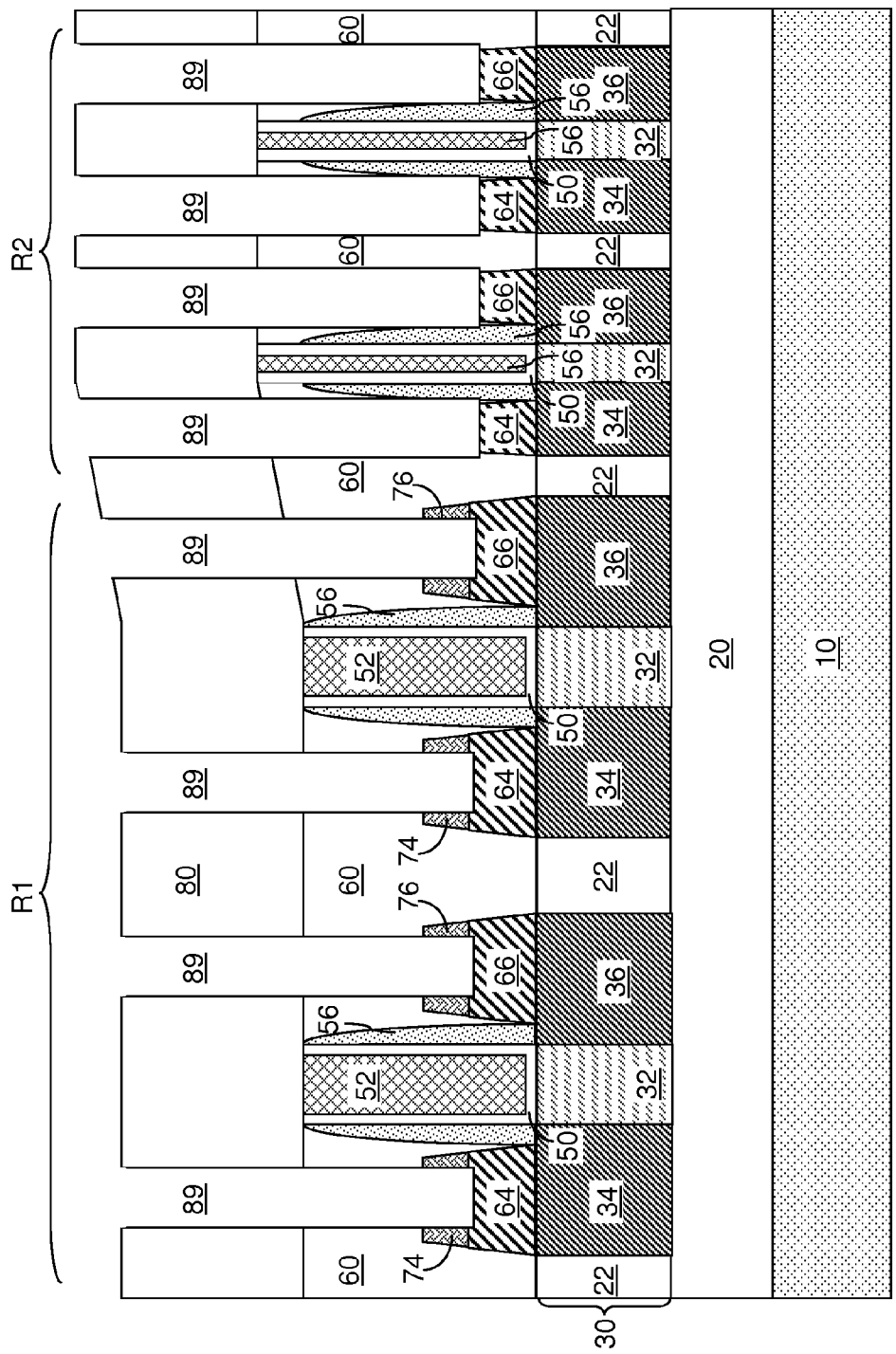
FIG. 12 is a vertical cross-sectional view of a variation of the exemplary semiconductor structure after formation of various contact via holes according to an embodiment of the present disclosure.

Referring to FIG. 12, a variation of the exemplary semiconductor structure is shown at a processing step corresponding to the processing step of FIG. 8, i.e., after formation of various contact via holes 89. Contact via cavities 89 are formed through the contact-level dielectric layer 80 and planarization dielectric layer 60 by an anisotropic etch that employs the carbon-doped semiconductor material portions (74, 76) as a stopping layers. In this variation, the anisotropic etch process may be terminated after the carbon-doped semiconductor material portions (74, 76) are etched through, and surfaces of carbon-free semiconductor material portions (64, 66) are physically exposed. Thus, at least one bottom surface of the contact via cavities 89 can be at least one surface of the carbon-free semiconductor material portions (64, 66). The processing steps of FIGS. 9-11 can be subsequently performed to provide a semiconductor structure that is the same as the exemplary semiconductor structure of FIG. 11.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A semiconductor structure comprising:
a first semiconductor material portion located on a first region of a substrate and including a first source region, a first drain region, and a first body region, and a second semiconductor material portion located on a second region of said substrate and including a second source region, a second drain region, and a second body region, wherein said first semiconductor material portion has a lateral dimension greater than a lateral dimension of said second semiconductor material portion;
a first gate stack structure located over said first body region and a second gate stack structure located over said second body region, said first gate stack structure having a height less than a height of said second gate stack structure;
a planarization dielectric layer overlying said first and second semiconductor material portions and laterally surrounding said first gate stack structure and said second gate stack structure;
a contact-level dielectric layer located on the planarization dielectric layer, wherein a bottommost surface of the contact-level dielectric layer that is in direct contact with a topmost surface of said first gate stack structure and a topmost surface of said planarization dielectric layer in said first region is lower than a bottommost surface of the contact-level dielectric layer that is in direct contact with a topmost surface of said second gate stack structure and a topmost surface of said planarization dielectric layer in said second region;
a contact via structure having an upper portion and a lower portion and located in a contact via cavity, wherein the upper portion of the contact via structure is embedded in said contact-level dielectric layer, wherein the lower portion of the contact via structure is embedded in said planarization dielectric layer, wherein an edge of the upper portion of the contact via structure is aligned with an edge of the lower portion of the contact via structure, and wherein a top surface of the upper portion of the contact via structure is coplanar with a top surface of the contact-level dielectric layer; and
a carbon-containing metal semiconductor alloy portion underlying said contact via structure and contacting one of said first source region, said first drain region, said second source region, and said second drain region, wherein said first source region, said first drain region, said second source region, and said second drain region are substantially free of carbon and wherein a volume of said carbon-containing metal semiconductor alloy portion extends within a lower portion of said contact via cavity.

2. The semiconductor structure of claim 1, wherein an atomic concentration of carbon in said carbon-containing metal semiconductor alloy portion increases with a vertical distance from a top surface of said substrate.

3. The semiconductor structure of claim 2, wherein a ratio of carbon atoms to semiconductor atoms in said carbon-containing metal semiconductor alloy portion is greater than 0.01.

4. The semiconductor structure of claim 1, wherein said carbon-containing metal semiconductor alloy portion is doped with at least one electrical dopant.

5. The semiconductor structure of claim 4, wherein a total atomic concentration of said at least one electrical dopant in said carbon-containing metal semiconductor alloy portion decreases with a vertical distance from a top surface of said substrate.

6. The semiconductor structure of claim 4, wherein said at least one electrical dopant is at least one n-type dopant.

7. The semiconductor structure of claim 4, wherein said carbon-containing metal semiconductor alloy portion comprises a carbon-containing metal silicide.

8. The semiconductor structure of claim 4, wherein said first source region, said first drain region, said second source region, and said second drain region consist of silicon and dopant atoms having a same conductivity type as said at least one electrical dopant.

9. The semiconductor structure of claim 1, wherein sidewalls of a bottom portion of said contact via structure are vertically coincident with sidewalls of a top surface of said carbon-containing metal semiconductor alloy portion.

10. The semiconductor structure of claim 1, wherein each of said first gate stack structure and said second gate stack structure includes a gate dielectric and a gate electrode that is embedded in said gate dielectric.

11. A semiconductor structure comprising:
a first semiconductor material portion located on a first region of a substrate and including a first source region, a first drain region, and a first body region, and a second semiconductor material portion located on a second region of said substrate and including a second source region, a second drain region, and a second body region, wherein said first semiconductor material portion has a lateral dimension greater than a lateral dimension of said second semiconductor material portion;

a first gate stack structure located over said first body region and a second gate stack structure located over said second body region, said first gate stack structure having a height less than a height of said second gate stack structure;

a planarization dielectric layer overlying said first and second semiconductor material portions and laterally surrounding said first gate stack structure and said second gate stack structure;

a contact-level dielectric layer located on the planarization dielectric layer, wherein a bottommost surface of the contact-level dielectric layer that is in direct contact with a topmost surface of said first gate stack structure and a topmost surface of said planarization dielectric layer in said first region is lower than a bottommost surface of the contact-level dielectric layer that is in direct contact with a topmost surface of said second gate stack structure and a topmost surface of said planarization dielectric layer in said second region;

a contact via structure having an upper portion and a lower portion, wherein the upper portion of the contact via structure is embedded in said contact-level dielectric layer, and wherein the lower portion of the contact via structure is embedded in said planarization dielectric layer, wherein an edge of the upper portion of the contact via structure is aligned with an edge of the lower portion of the contact via structure, and wherein a top surface of the upper portion of the contact via structure is coplanar with a top surface of the contact-level dielectric layer;

a carbon-containing metal semiconductor alloy portion underlying said contact via structure and contacting one of said first source region, said first drain region, said second source region, and said second drain region, wherein said first source region, said first drain region, said second source region, and said second drain region are substantially free of carbon, and wherein a portion of one sidewall surface of said carbon-containing metal semiconductor alloy portion is in direct physical contact with a surface of said planarization dielectric layer, and a portion of another sidewall surface of said carbon-containing metal semiconductor alloy portion is in direct physical contact with another surface of said planarization dielectric layer.

12. The semiconductor structure of claim 11, wherein an atomic concentration of carbon in said carbon-containing metal semiconductor alloy portion increases with a vertical distance from a top surface of said substrate.

13. The semiconductor structure of claim 12, wherein a ratio of carbon atoms to semiconductor atoms in said carbon-containing metal semiconductor alloy portion is greater than 0.01.

14. The semiconductor structure of claim 11, wherein said carbon-containing metal semiconductor alloy portion is doped with at least one electrical dopant.

15. The semiconductor structure of claim 14, wherein a total atomic concentration of said at least one electrical dopant in said carbon-containing metal semiconductor alloy portion decreases with a vertical distance from a top surface of said substrate.

16. The semiconductor structure of claim 14, wherein said at least one electrical dopant is at least one n-type dopant.

17. The semiconductor structure of claim 14, wherein said carbon-containing metal semiconductor alloy portion comprises a carbon-containing metal silicide.

18. The semiconductor structure of claim 14, wherein said first source region, said first drain region, said second source region, and said second drain region consist of silicon and dopant atoms having a same conductivity type as said at least one electrical dopant.

19. The semiconductor structure of claim 11, wherein sidewalls of a bottom portion of said contact via structure are vertically coincident with sidewalls of a top surface of said carbon-containing metal semiconductor alloy portion.

20. The semiconductor structure of claim 11, wherein each of said first gate stack structure and said second gate stack structure includes a gate dielectric and a gate electrode that is embedded in said gate dielectric.

* * * * *